United States Patent
Meinhold et al.

(10) Patent No.: US 12,002,812 B2
(45) Date of Patent: Jun. 4, 2024

(54) METHOD OF PRODUCING A SEMICONDUCTOR COMPONENT AND SEMICONDUCTOR COMPONENT

(71) Applicant: Infineon Technologies Dresden GmbH & Co. KG, Dresden (DE)

(72) Inventors: Dirk Meinhold, Dresden (DE); Steffen Bieselt, Wehlen (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 59 days.

(21) Appl. No.: 17/678,580

(22) Filed: Feb. 23, 2022

(65) Prior Publication Data
US 2022/0285402 A1 Sep. 8, 2022

(30) Foreign Application Priority Data
Mar. 8, 2021 (DE) .......................... 102021105476.1

(51) Int. Cl.
*H01L 21/02* (2006.01)
*H01L 27/12* (2006.01)

(52) U.S. Cl.
CPC .... *H01L 27/1203* (2013.01); *H01L 21/02422* (2013.01); *H01L 21/02554* (2013.01); *H01L 21/02595* (2013.01)

(58) Field of Classification Search
CPC ...... B81B 2201/0264; B81B 2201/025; B81B 7/02; B81B 7/0032; B81B 2203/01; B81C 1/00269; H01L 2924/161; H01L 2924/163
See application file for complete search history.

(56) References Cited

U.S. PATENT DOCUMENTS

| 5,295,395 | A | 3/1994 | Hocker et al. |
| 6,076,404 | A * | 6/2000 | Muchow ............... G01L 9/0054 |
| | | | 73/514.32 |
| 6,465,854 | B1 * | 10/2002 | Muenzel ............ B81C 1/00269 |
| | | | 257/417 |
| 2006/0255901 | A1 | 11/2006 | Schwarz |
| 2009/0020419 | A1 * | 1/2009 | Suzuki ............... G01C 19/5719 |
| | | | 204/400 |
| 2014/0264643 | A1 | 9/2014 | Baskaran |
| 2014/0357006 | A1 | 12/2014 | Ben Mbarek et al. |
| 2017/0107098 | A1 * | 4/2017 | Filhol ................... B81B 7/0048 |
| 2019/0157138 | A1 * | 5/2019 | Cheng ............. H01L 21/76256 |

FOREIGN PATENT DOCUMENTS

| DE | 19800574 A1 | 7/1999 |
| DE | 60318545 T2 | 2/2008 |
| DE | 102009026639 A1 | 12/2010 |
| DE | 102010039180 A1 | 2/2012 |
| DE | 102013211970 A1 | 1/2015 |
| DE | 102012025750 A1 | 9/2015 |
| EP | 3263517 A1 | 1/2018 |
| WO | 9904422 A1 | 1/1999 |

* cited by examiner

*Primary Examiner* — Farun Lu
*Assistant Examiner* — Sandra Milena Rodriguez Villanu
(74) *Attorney, Agent, or Firm* — Murphy, Bilak & Homiller, PLLC

(57) ABSTRACT

A method of producing a semiconductor component includes: providing a silicon-based substrate; depositing an oxide layer on the silicon-based substrate; depositing a polycrystalline silicon layer on the oxide layer and simultaneously a crystalline silicon layer on the silicon-based substrate; producing an electronic component based on the polycrystalline silicon layer; and mounting a glass- or silicon-based lid on the crystalline silicon layer.

20 Claims, 3 Drawing Sheets

METHOD OF PRODUCING A SEMICONDUCTOR COMPONENT AND SEMICONDUCTOR COMPONENT

TECHNICAL FIELD

The present disclosure relates to a method of producing a semiconductor component and to a semiconductor component.

BACKGROUND

In the field of semiconductor components, sensor components are an important and growing subsector. These sensor components may be manufactured as microelectromechanical (MEMS) sensors and are often constructed in such a way that they contain an inner cavity accommodating the actual sensor. In the case of acceleration sensors, this contains a spring-suspended seismic mass. In the event of action of an external acceleration, the inertia force acts on the seismic mass and leads to a deflection that can be detected by means of various methods, for example in a capacitive, piezoresistive or optical method.

For acceleration sensors of the type described, but also for pressure or vibration sensors, gyroscopes, or time-recording components, it is of essential importance to be able to provide a high quality, i.e. low damping of the oscillating seismic mass. More particularly, it is important that the damping that exists after production remains constant over the course of the lifetime of the sensor component.

For these and other reasons, there is a need for the present disclosure.

SUMMARY

A first aspect of the present disclosure relates to a method of producing a semiconductor component, wherein the method comprises: providing a silicon-based substrate; depositing an oxide layer on the substrate; depositing a polycrystalline silicon layer on the oxide layer and simultaneously a crystalline silicon layer on the substrate; producing an electronic component based on the polycrystalline silicon layer; and mounting a glass- or silicon-based lid on the crystalline silicon layer.

A second aspect of the present disclosure relates to a semiconductor component comprising: a silicon-based substrate; an oxide layer atop the substrate; an electronic component based on polycrystalline silicon; a crystalline silicon layer atop the substrate and atop lateral faces of the oxide layer; and a glass- or silicon-based lid connected to the crystalline silicon layer.

The present disclosure is based on the finding that the crucial factor for damping is the friction of the oscillating seismic mass on gas molecules, i.e. air molecules in particular, in the cavity, whereas mechanical damping resulting from the suspension of the mass plays a minor role. It is therefore of crucial importance that no outgassing from the cavity into the environment takes place over the course of the component lifetime. For this purpose, the method according to the first aspect provides the option of applying a glass- or silicon-based lid to the crystalline silicon layer. As is yet to be described, it is thus possible to provide a connection between lid and crystalline silicon layer with optimal imperviousness.

BRIEF DESCRIPTION OF THE DRAWINGS

A semiconductor component and a method of producing a semiconductor component according to the disclosure are elucidated in detail hereinafter with reference to drawings. The elements shown in the drawings are not necessarily reproduced true to scale with respect to one another. Identical reference numerals may refer to identical components. The same reference numbers refer to corresponding identical or similar parts.

DETAILED DESCRIPTION

The detailed description that follows makes reference to the appended drawings that form part of this description and in which specific embodiments in which the disclosure can be implemented are shown by way of illustration. In this context, directional terminology such as "top", "bottom", "front", "back", "leading", etc. is used in relation to the alignment of the figure(s) to be described. Since the constituents of embodiments can be positioned in different orientations, the statement of direction is used by way of illustration and is not limiting in any way. It will be appreciated that other embodiments may also be used and structural or logical changes may be made without surpassing the scope of the present invention. The detailed description that follows should therefore not be understood in a limiting manner, and the scope of the present disclosure is defined by the appended claims.

It should be noted that the features of the different illustrative embodiments described here can be combined with one another, unless explicitly stated otherwise.

As used in this description, the terms "bonded", "secured", "connected", "coupled" and/or "electrically connected/electrically coupled" do not mean that the elements or layers must be in direct contact with one another; intervening elements or layers may be provided between the "bonded", "secured", "connected", "coupled" and/or "electrically connected/electrically coupled" elements. According to the disclosure, the abovementioned terms may, however, optionally also have the specific meaning that the elements or layers are in direct contact with one another, meaning that no intervening elements or layers are provided between the "bonded", "secured", "connected", "coupled" and/or "electrically connected/electrically coupled" elements.

Moreover, the word "above" which is used in relation to a part, element or material layer formed or disposed "above" a surface may mean herein that the part, element or material layer is disposed (e.g. positioned, formed, deposited etc.) "indirectly" above the surface implied, in which case one or more additional parts, elements or layers are disposed between the surface implied and the part, element or material layer. However, the word "above" which is used in relation to a part, element or material layer formed or disposed "above" a surface may optionally also have the specific meaning that the part, element or material layer is disposed (e.g. positioned, formed, deposited etc.) "directly on", for example in direct contact with, the surface implied.

Figure 1A:
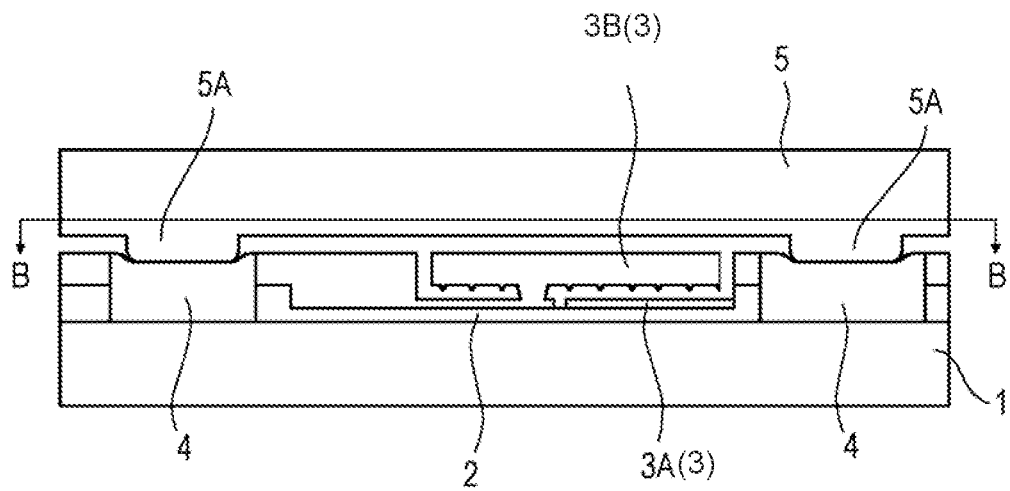
FIGS. 1A and 1B illustrate a working example of a semiconductor component in a vertical cross section along a plane (A) identified by A-A in FIGS. 1B and 1$n$ a horizontal cross section along a plane (B) identified by B-B in FIG. 1A, with the semiconductor component in the form of an acceleration sensor.
Figure 1B:
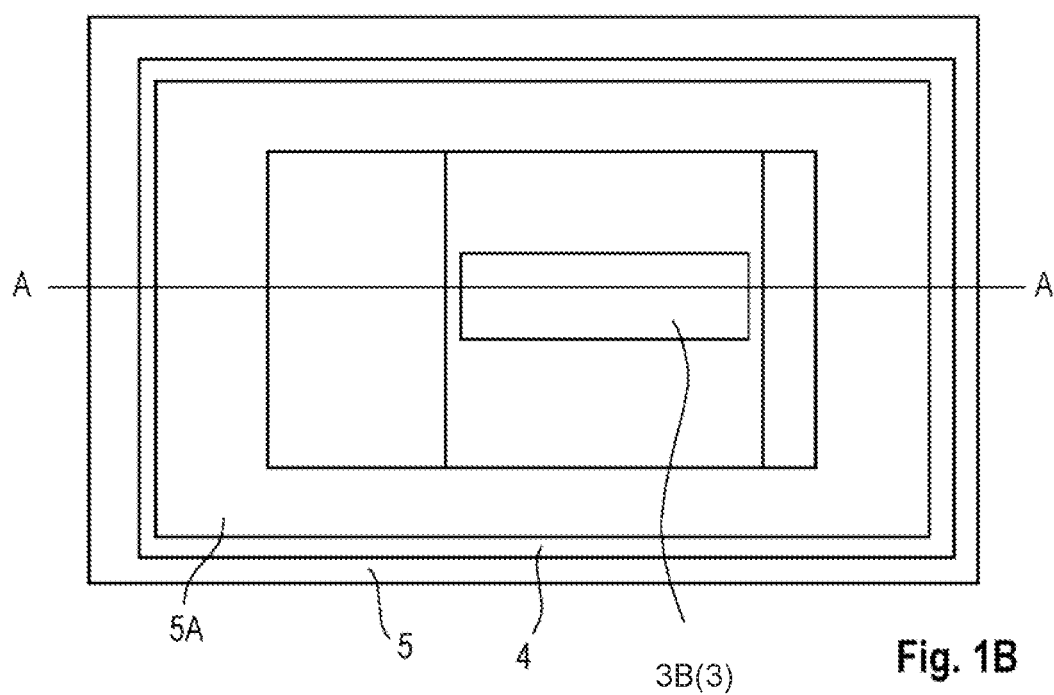

FIGS. 1A and 1B illustrate a working example of a semiconductor component in a vertical cross section along a plane (A) identified by A-A in FIGS. 1B and 1n a horizontal cross section along a plane (B) identified by B-B in FIG. 1A, with the semiconductor component in the form of an acceleration sensor.

Specifically, FIGS. 1A and 1B show a semiconductor component 10, with a silicon-based substrate 1, an oxide layer 2 disposed atop the substrate 1, an electronic component 3 based on polycrystalline silicon, a crystalline silicon layer 4 disposed atop the substrate 1 and atop lateral faces of the oxide layer 2, and a glass- or silicon-based lid 5 connected to the crystalline layer 4.

The semiconductor component 10 in the present case is a sensor component, and the electronic component is an acceleration sensor, which will be discussed in more detail further down.

The semiconductor component 10 additionally also has electrical contacts on one or both of the surfaces of substrate or lid, and through-contacts to these electrical contacts, neither of which is shown here, for reasons of clarity and simplicity.

The crystalline silicon layer 4 is grown on simultaneously with a polycrystalline silicon layer, from which the acceleration sensor 3 is then formed. The crystalline silicon layer 4 has been grown onto the substrate by epitaxial growth. This will be described in detail further down.

As shown in FIGS. 1A and 1B, the lid 5 may have a projection 5A connected to the crystalline silicon layer 4. In addition, the crystalline silicon layer 4 may surround the electronic component in the shape of a ring, and the projection may in turn be ring-shaped and have spatial dimensions corresponding to the spatial dimensions of the ring-shaped silicon layer. More particularly, as shown, the projection 5 may have a constant lateral diameter over its entire circumference, and the crystalline silicon layer 4 may likewise have a constant lateral diameter over its entire circumference, in which case the lateral diameter of the projection 5A is preferably slightly smaller than the lateral diameter of the crystalline silicon layer 4, such that the projection 5A is connected to the crystalline layer 4 over its entire width.

As also shown in FIGS. 1A and 1B, the spatial region surrounded by the crystalline silicon layer 4 in the shape of a ring and provided for the arrangement of the acceleration sensor 3 is of rectangular or square shape. But a different geometric shape, for instance a circular shape, may likewise be envisaged for this region.

In the case of a silicon-based lid 5, it may be the case that this is applied to the crystalline silicon layer 4 by a wafer bonding process. This is promoted by virtue of the epitaxially grown crystalline silicon layer 4 having a high crystal quality at its surface.

In the case of a glass- or quartz-based lid 5, it may be the case that this is applied to the crystalline silicon layer 4 by an anodic bonding process.

The electronic component 3 may take the form of or include a MEMS component.

The electronic component 3 may also include one or more from a group comprising an acceleration sensor, a pressure sensor, a vibration sensor, a gyroscope or a time-recording component.

One advantage of the semiconductor component 10 is also that the lid 5 is electrically connected to the crystalline layer 4 and hence to the substrate 1, meaning that no potential difference can be established between them. Such a potential difference may be disadvantageous since it can result in an electrostatic force on the MEMS.

Figure 2:
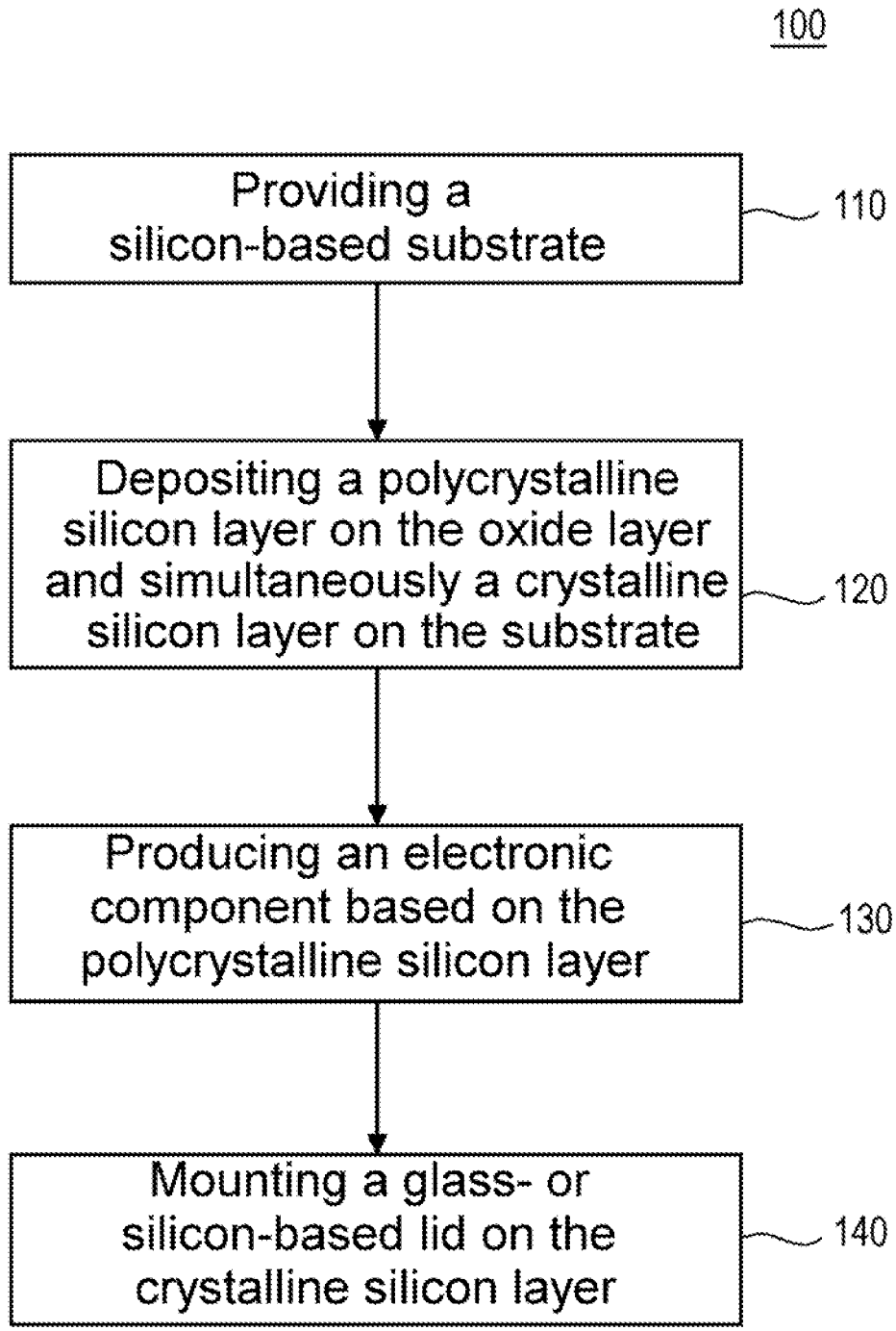
FIG. 2 illustrates a flow diagram for a method of producing a semiconductor component.

FIG. 2 shows a flow diagram for a method of producing a semiconductor component.

The method (100) of producing a semiconductor component comprises: providing a silicon-based substrate (110); depositing an oxide layer on the substrate; depositing a polycrystalline silicon layer on the oxide layer and simultaneously a crystalline silicon layer on the substrate (120); producing an electronic component based on the polycrystalline silicon layer (130); and mounting a glass- or silicon-based lid on the crystalline layer (140).

By way of illustration of the method, a working example is described hereinafter.

FIGS. 3A to 3E illustrate lateral cross-sectional views of intermediates and a semiconductor component for illustration of a working example of the method of producing the semiconductor component of FIGS. 1A and 1B.

It may be the case that the semiconductor component is one composed of a multitude of semiconductor components that are to be produced on a substrate in the form of a silicon wafer.

Figure 3A:
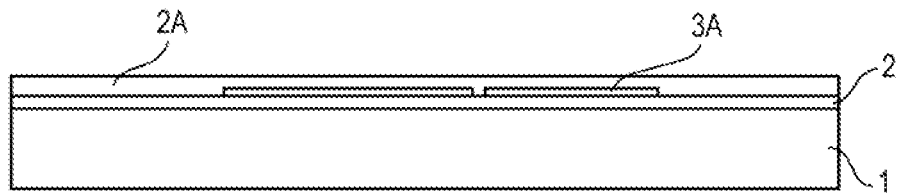
FIGS. 3A to 3E illustrate lateral cross-sectional views of intermediates and a semiconductor component for illustration of a working example of the method of producing the semiconductor component of FIGS. 1A and 1B.

FIG. 3A shows a cross-sectional view of an intermediate comprising a silicon-based substrate 1 to which a first oxide layer 2 (SiO2) has been applied, a first polysilicon layer 3A thereto, and a second oxide layer 2A (SiO2) thereto. A section of the first oxide layer 2 remains in the component and serves as an insulation layer, while the second oxide layer 2A is a sacrificial layer, as will be seen.

The substrate 1 may have a thickness within a range from 100 μm to 1 mm, the first oxide layer 2 a thickness within a range from 5 μm to 10 μm, the first polysilicon layer 3A a thickness within a range from 1 μm to 2 μm, and the second oxide layer 2A within a range from 5 μm to 10 μm.

Figure 3B:
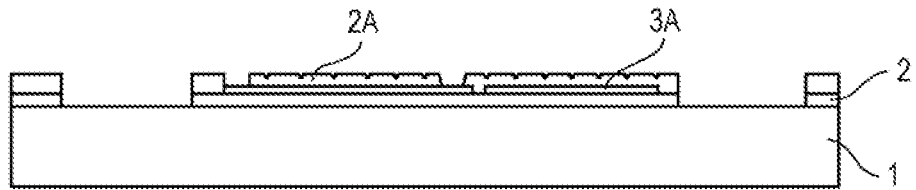

FIG. 3B shows a cross-sectional view of a further intermediate, which is obtained after removal of a ring-shaped section of the first and second oxide layers 2 and 2A. The spatial position of this ring-shaped section corresponds to that of the crystalline silicon layer to be formed. Sections of the second oxide layer 2A above the first polysilicon layer 3A are also removed in order to expose the first polysilicon layer 3A in these sections. This serves to prepare for the subsequent epitaxial process of deposition of the second polysilicon layer 3B. The removal of the sections mentioned can be performed by an etching step, especially by dry etching.

Figure 3C:
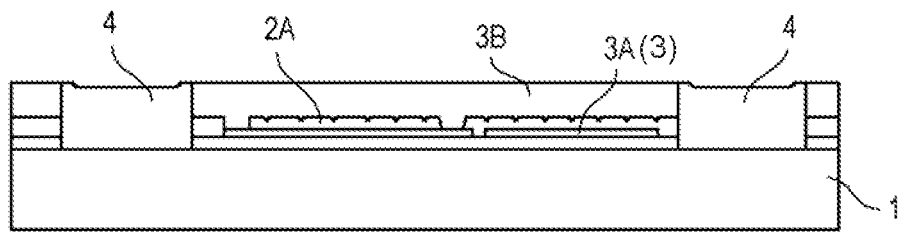

FIG. 3C shows a cross-sectional view of an intermediate which is obtained after performance of the epitaxial deposition. This involves epitaxial growth of a second polysilicon layer 3B on the exposed sections of the first polysilicon layer 3A. Likewise grown epitaxially is a crystalline silicon layer (c-Si) 4 on the exposed ring-shaped section of the crystalline substrate 1 (crystalline is used here synonymously throughout the text with monocrystalline). The crystalline silicon layer 4 thus also covers the lateral faces of the oxide layer 2. The second polysilicon layer 3B may have a thickness within a range from 15 μm to 25 μm, and the crystalline silicon layer 4 may have a thickness within a range from 30 μm to 40 μm.

The deposition of the second polycrystalline silicon layer 3B and of the crystalline silicon layer 4 can be performed in a conventional epitaxy reactor from the gas phase with reduced pressure. The deposition can be conducted in such a way that, in the area of the later sensor cell, first a thin (about 100 nm) seed layer of polysilicon is deposited on the second oxide layer 2A with silane (SiH4) in an H2 carrier at 800° C. and 600 torr with an SiH4 gas flow rate of 60 sccm for 90 s. Subsequently, the deposition can be continued by using dichlorosilane (DCS, SiH2Cl2) at 1080° C. and 30 torr in order to epitaxially deposit the second polysilicon layer 3B with a thickness of about 20 µm at a flow rate of 400 sccm in an H2 carrier. In order to establish electrical conductivity of the second polysilicon layer 3B, polysilicon was n-doped in situ in the growth process by addition of monophosphine (PH3) with a flow rate of 100 sccm. The growth rate in the growing-on of the second polysilicon layer 3B may be about 1 µm/min under the deposition conditions mentioned.

The n-doping of the second polycrystalline layer 3B by addition of monophosphine during the growth naturally likewise entails n-doping of the crystalline silicon layer 4, which then likewise becomes electrically conductive. An even greater electrical conductivity can thus be expected than in the second polycrystalline layer 3B, since grain boundaries present in the latter have the property of capturing some of the doping atoms, which can then no longer function as electron donors. Such grain boundaries do not exist in (mono) crystalline silicon, or only in a considerably lower density if they do.

It should also be mentioned that doping is not absolutely necessary during the growth process. It is also possible to grow undoped silicon. If parts of the MEMS sensor should indeed require electrical conductivity, it is also possible to undertake separate ion implantations.

After the deposition process has ended, chemical-mechanical polishing (CMP), especially of the surface of the second polysilicon layer 3B, can also be conducted since, as is well known, polysilicon layers grown from the gas phase have high surface roughness.

Figure 3D:
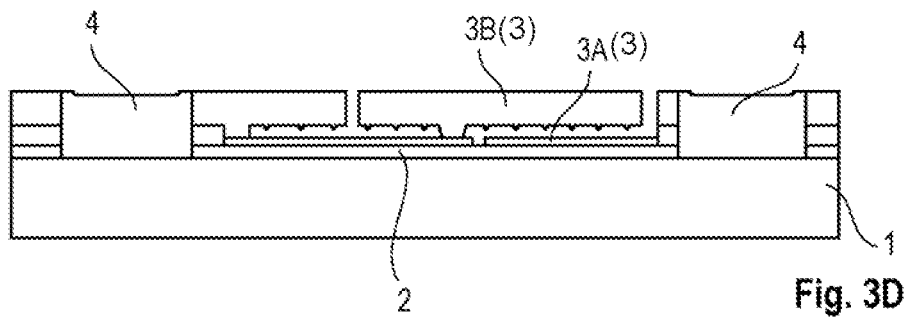
Figure 3E:
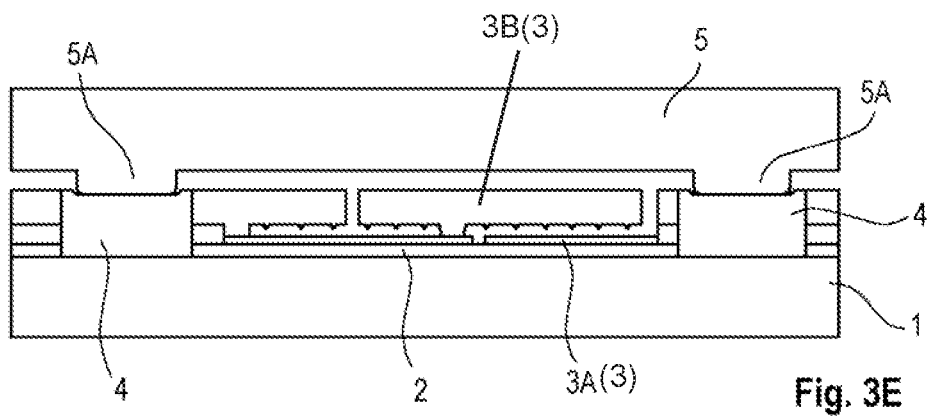

FIG. 3D shows a cross-sectional view of a sensor component 3 as already shown and described in FIGS. 1A and 1B, and FIG. 3E shows a cross-sectional view of a semiconductor component as obtained by mounting of a glass- or silicon-based lid 5 on the crystalline silicon layer 4 as already shown and described in FIGS. 1A and 1B. The lid 5 is prefabricated such that it has a ring-shaped projection 5A corresponding in terms of its spatial dimensions to those of the ring-shaped crystalline silicon layer 4.

As already mentioned, the substrate may be provided as a silicon-based wafer, such that the above method steps produced a multitude of sensor elements. A lid wafer is then likewise also provided, on which a multitude of lid elements have been prefabricated. The lid elements are essentially formed by ring-shaped projections 5A that are arranged in such a spatial distribution that they come to rest above the MEMS sensors of the substrate wafer.

If both substrate wafer and lid wafer take the form of silicon wafers, they can then each be bonded to one another by direct silicon bonding. In this process which is known per se, the two wafers are pressed against one another at high temperature and high pressure. The process temperature may, for example, be within a range between 500° C. and 1200° C., while the pressure may be within a range between 15 MPa and 20 MPa. In the case of a glass- or quartz-based lid wafer, it is possible to use anodic bonding in which the glass wafer is contacted with the silicon wafer and a voltage is applied such that the negative pole is on the glass. The process temperature here is typically above 300° C., and the voltage within a range between 50 and 1000 V.

It may be the case that the bonding is conducted under ambient conditions, such that the cavity in the finished sensor component is filled with air under atmospheric pressure. However, it may also be the case that the bonding is conducted in such a way that a gentle vacuum is established in the cavity or in such a way that a different gas is introduced into the cavity.

Methods and apparatuses according to the disclosure are elucidated hereinafter by examples.

Example 1 is a method of producing a semiconductor component, wherein the method comprises: providing a silicon-based substrate; depositing an oxide layer on the substrate; depositing a polycrystalline silicon layer on the oxide layer and simultaneously a crystalline silicon-based layer on the substrate; producing an electronic component based on the polycrystalline silicon layer; and mounting a glass- or silicon-based lid on the crystalline silicon layer.

Example 2 is a method according to example 1, in which the lid has a projection connected to the crystalline layer.

Example 3 is a method according to example 1 or 2, in which the crystalline layer surrounds the electronic component in the shape of a ring.

Example 4 is a method according to examples 2 and 3, in which the projection is ring-shaped and has spatial dimensions corresponding to the spatial dimensions of the crystalline layer.

Example 5 is a method according to any of the preceding examples, in which the mounting of the silicon-based lid on the crystalline layer comprises wafer bonding.

Example 6 is a method according to example 5, in which the wafer bonding is conducted at a temperature exceeding 500° C.

Example 7 is a method according to any of the preceding examples, in which the mounting of the glass-based lid on the crystalline layer comprises anodic bonding.

Example 8 is a method according to any of the preceding examples, in which the deposition of the polycrystalline silicon layer and of the crystalline layer comprises the growth of the layer from the gas phase using silane.

Example 9 is a method according to any of the preceding examples, in which the production of an electronic component comprises the production of a MEMS component.

Example 10 is a method according to example 9, in which the MEMS component includes one or more from a group comprising an acceleration sensor, a pressure sensor, a vibration sensor, a gyroscope or a time-recording component.

Example 11 is a semiconductor component comprising: a silicon-based substrate; an oxide layer atop the substrate; an electronic component based on polycrystalline silicon; a crystalline silicon-based layer atop the substrate and atop lateral faces of the oxide layer; and a glass- or silicon-based lid connected to the crystalline layer.

Example 12 is a semiconductor component according to example 11, in which the lid has a projection connected to the crystalline silicon layer.

Example 13 is a semiconductor component according to example 11 or 12, in which the crystalline silicon layer surrounds the electronic component in the shape of a ring.

Example 14 is a semiconductor component according to example 12 and 13, in which the projection is ring-shaped and has spatial dimensions corresponding to the spatial dimensions of the crystalline silicon layer Example 15 is a semiconductor component according to any of examples 11 to 14, in which the electronic component includes a MEMS component.

Example 16 is a semiconductor component according to example 15, in which the MEMS component includes one or more from a group comprising an acceleration sensor, a pressure sensor, a vibration sensor, a gyroscope or a time-recording component.

Even though specific embodiments have been illustrated and described here, those of ordinary skill in the art will appreciate that a multitude of alternative and/or equivalent implementations can replace the specific embodiments shown and described, without exceeding the scope of the present disclosure. This application is intended to cover all adaptations or variations of the specific embodiments addressed here. It is therefore intended that this disclosure is limited solely by the claims and their equivalents.

What is claimed is:

1. A method of producing a semiconductor component, the method comprising:
    providing a silicon-based substrate;
    depositing an oxide layer on the silicon-based substrate;
    removing a ring-shaped section of the oxide layer to provide a corresponding exposed ring-shaped section on the silicon-based substrate;
    depositing a polycrystalline silicon layer on the oxide layer and simultaneously a crystalline silicon layer on the exposed ring-shaped section on the silicon-based substrate to form a ring-shaped crystalline silicon layer;
    producing an electronic component based on the polycrystalline silicon layer, wherein the ring-shaped crystalline silicon layer surrounds the electronic component; and
    mounting a glass- or silicon-based lid on the ring-shaped crystalline silicon layer.

2. The method of claim 1, wherein the lid has a projection connected to the ring-shaped crystalline silicon layer.

3. The method of claim 2, wherein the projection is ring-shaped and has spatial dimensions corresponding to spatial dimensions of the ring-shaped crystalline silicon layer.

4. The method of claim 1, wherein the mounting of the silicon-based lid on the crystalline ring-shaped silicon layer comprises wafer bonding.

5. The method of claim 4, wherein the wafer bonding is conducted at a temperature exceeding 500° C.

6. The method of claim 1, wherein the mounting of the glass-based lid on the ring-shaped crystalline silicon layer comprises anodic bonding.

7. The method of claim 1, wherein the depositing of the polycrystalline silicon layer and of the ring-shaped crystalline silicon layer comprises growth from a gas phase using silane.

8. The method of claim 1, wherein the producing of an electronic component comprises producing of a MEMS component.

9. The method of claim 8, wherein the MEMS component includes one or more selected from the group consisting of an acceleration sensor, a pressure sensor, a vibration sensor, a gyroscope, and a time-recording component.

10. A method of producing a semiconductor component, the method comprising:
    providing a silicon-based substrate;
    depositing an oxide layer on the silicon-based substrate;
    removing a ring-shaped section of the oxide layer to provide a corresponding exposed ring-shaped section on the silicon-based substrate;
    depositing a polycrystalline silicon layer on the oxide layer and simultaneously a crystalline silicon layer on the exposed ring-shaped section on the silicon-based substrate to form a ring-shaped crystalline silicon layer;
    producing an electronic component based on the polycrystalline silicon layer, wherein the ring-shaped crystalline silicon layer surrounds the electronic component;
    providing a glass- or silicon-based lid having a ring-shaped projection having spatial dimensions corresponding to spatial dimensions of the ring-shaped crystalline silicon layer; and
    mounting the glass- or silicon-based lid on the ring-shaped crystalline silicon layer such that the ring-shaped projection of the lid is connected to the ring-shaped crystalline silicon layer.

11. The method of claim 10, wherein a lateral diameter of the ring-shaped projection is smaller than a lateral diameter of the ring-shaped crystalline silicon layer.

12. The method of claim 10, wherein the mounting of the silicon-based lid on the crystalline ring-shaped silicon layer comprises wafer bonding.

13. The method of claim 10, wherein the mounting of the glass-based lid on the ring-shaped crystalline silicon layer comprises anodic bonding.

14. The method of claim 10, wherein the producing of an electronic component comprises producing of a MEMS component.

15. A method of producing a semiconductor component, the method comprising:
    providing a silicon-based substrate;
    depositing an oxide layer on the silicon-based substrate;
    removing a ring-shaped section of the oxide layer to provide a corresponding exposed ring-shaped section on the silicon-based substrate;
    depositing a polycrystalline silicon layer on the oxide layer and simultaneously a crystalline silicon layer on the exposed ring-shaped section on the silicon-based substrate to form a ring-shaped crystalline silicon layer;
    producing a MEMS component based on the polycrystalline silicon layer, wherein the ring-shaped crystalline silicon layer surrounds the MEMS component; and
    mounting a glass- or silicon-based lid on the ring-shaped crystalline silicon layer.

16. The method of claim 15, wherein the MEMS component includes one or more selected from the group consisting of an acceleration sensor, a pressure sensor, a vibration sensor, a gyroscope, and a time-recording component.

17. The method of claim 15, wherein the lid has a projection connected to the ring-shaped crystalline silicon layer.

18. The method of claim 17, wherein the projection is ring-shaped and has spatial dimensions corresponding to spatial dimensions of the ring-shaped crystalline silicon layer.

19. The method of claim 15, wherein the mounting of the silicon-based lid on the crystalline ring-shaped silicon layer comprises wafer bonding.

20. The method of claim 15, wherein the mounting of the glass-based lid on the ring-shaped crystalline silicon layer comprises anodic bonding.

* * * * *